(12) United States Patent
Kosyachkov

(10) Patent No.: US 7,282,123 B2
(45) Date of Patent: Oct. 16, 2007

(54) COMPOSITE SPUTTER TARGET AND PHOSPHOR DEPOSITION METHOD

(75) Inventor: Alexander Kosyachkov, Mississauga (CA)

(73) Assignee: Ifire Technology Corp., Fort Saskatchewan, Alberta (CA)

(*) Notice: Subject to any disclaimer, the term of this patent is extended or adjusted under 35 U.S.C. 154(b) by 559 days.

(21) Appl. No.: 10/736,255

(22) Filed: Dec. 15, 2003

(65) Prior Publication Data

US 2004/0149567 A1    Aug. 5, 2004

Related U.S. Application Data

(60) Provisional application No. 60/433,576, filed on Dec. 16, 2002.

(51) Int. Cl.
C23C 14/34    (2006.01)

(52) U.S. Cl. .................. 204/192.26; 204/192.29; 204/298.13; 204/298.12; 204/192.12; 204/192.15

(58) Field of Classification Search ........... 204/192.12, 204/192.15, 192.26, 192.29, 298.12, 298.13
See application file for complete search history.

(56) References Cited

U.S. PATENT DOCUMENTS

| | | | | |
|---|---|---|---|---|
| 3,803,438 A | * | 4/1974 | Hanak | ........................ 313/483 |
| 4,172,020 A | | 10/1979 | Tisone et al. | |
| 4,675,092 A | | 6/1987 | Baird | |
| 4,725,344 A | | 2/1988 | Yocom | |
| 5,432,015 A | | 7/1995 | Wu | |
| 5,518,432 A | * | 5/1996 | Katou et al. | .................. 445/10 |
| 5,853,552 A | | 12/1998 | Ishihara | |
| 6,036,823 A | | 3/2000 | Inoguchi | |
| 6,338,908 B1 | | 1/2002 | Arai | |
| 6,447,654 B1 | | 9/2002 | Kosyachkov | |
| 6,610,352 B2 | | 8/2003 | Cheong | |
| 6,689,538 B2 | | 2/2004 | Hoffend et al. | |
| 2001/0043043 A1 | | 11/2001 | Aoyama et al. | |
| 2003/0118864 A1 | | 6/2003 | Kosyachkov | |

FOREIGN PATENT DOCUMENTS

| | | | |
|---|---|---|---|
| JP | 06-163157 | * | 6/1994 |
| WO | WO 02/097155 A1 | | 12/2002 |

* cited by examiner

Primary Examiner—Rodney G. McDonald
(74) Attorney, Agent, or Firm—Fay Sharpe LLP

(57) ABSTRACT

The invention is a novel sputter target and deposition method for multi-element thin film phosphors for thick film dielectric electroluminescent displays in which the deposited phosphors provide a high luminance and colors required for TV applications. The method comprises sputtering a single composite target in a low pressure sputtering atmosphere that comprises gases containing reactive species and non-reactive species. The composite target comprising a matrix phase and an inclusion phase, or two matrix phases, wherein one of the phases comprises one or more metallic elements that contribute to the composition of the phosphor and the other of the phases comprises the remaining elements that contribute to the composition of the phosphor. In the method the pressure of the reactive species within the sputtering atmosphere is varied to control the sputtering rate of the matrix and inclusion phases of the composite target to cause the ratio of the elements in the two phases to deposit in a desired ratio as a phosphor film on the substrate.

59 Claims, 2 Drawing Sheets

COMPOSITE SPUTTER TARGET AND PHOSPHOR DEPOSITION METHOD

This application claims priority from U.S. Provisional Application Ser. No. 60/433,576, filed on Dec. 16, 2002.

FIELD OF THE INVENTION

The present invention relates to the deposition of phosphor materials in full colour ac thick film dielectric electroluminescent displays. More specifically, the invention is a novel method involving the sputtering of a single composite target for depositing phosphor materials having a multi element composition in thick film dielectric electroluminescent displays.

BACKGROUND OF THE INVENTION

Thick film dielectric electroluminescent devices as described in U.S. Pat. No. 5,432,015 (the entirety of which is incorporated herein by reference) include a thick film dielectric structure that provides for superior resistance to dielectric breakdown as well as a reduced operating voltage as compared to TFEL displays. The thick film dielectric structure when deposited on a ceramic substrate withstands somewhat higher processing temperatures than TFEL devices, which are typically fabricated on glass substrates. This increased high temperature tolerance facilitates annealing of phosphor films at higher temperatures to improve their luminosity. However, even with this enhancement, improvements in display luminance and colour coordinates are desirable in order to keep pace with ongoing improvements to cathode ray tube (CRT) displays, particularly with recent trends in CRT specifications to higher luminance and higher colour temperature.

A high luminosity full colour thick film dielectric electroluminescent display requires that the thin film phosphor materials used for the red, green and blue sub-pixels be patterned so that the emission spectrum for each colour of pixel is tailored to minimize the attenuation associated with the optical filters needed to achieve the required colour coordinates for each sub-pixel. For relatively low-resolution displays patterning can be achieved by depositing the phosphor materials through a shadow mask. However, for high resolution displays the shadow mask technique does not provide adequate accuracy requiring that photolithographic methods be employed. Photolithographic techniques, as exemplified in U.S. patent application Ser. No. 09/540,288 (the entirety of which is incorporated herein by reference) require the deposition of photoresist films and the etching or lift-off of portions of the phosphor film to provide the required pattern. Such a patterning process typically involves the initial deposition of one phosphor material for one of the red, green or blue sub-pixels, followed by deposition of a photoresist layer that is patterned so that selected portion of the deposited phosphor film can be etched away above the other two sub-pixel locations where the first-deposited phosphor film is not desired. The second two phosphor layers can be patterned using a lift-off process, due to the underlying surface relief of the initial patterned layer that allows for the exposure of the edges of the photoresist film that underlies the second and third phosphor layers on their respective pixels. This process requires the use of a solvent that dissolves the photoresist film, thus allowing those portions of the phosphor layer overlying the resist to be lifted off without being dissolved. However, the initial phosphor film generally needs to be removed by a direct etching process where the overlying resist has been removed. This requires that the phosphor material be soluble in the etchant at that stage in the process. Stable phosphors are not typically very soluble, and it is desirable to have a phosphor in a precursor form deposited as a film that is not fully reacted that can be further processed to form the final stable phosphor material following the etching step. Nevertheless, the phosphor film in its precursor form must not react in an unfavourable way with the process environment or the etchant during the etching process. The phosphors and methods for processing these phosphors as described in the prior art to not fully meet these requirements and therefore the performance or stability of the final phosphor may be adversely affected.

Cerium activated strontium sulfide for blue phosphors and manganese activated zinc sulfide for red and green phosphors are typically used in full colour electroluminescent displays. The optical emission from these phosphor materials must be passed through an appropriate chromatic filter to achieve the necessary colour coordinates for red, green and blue sub-pixels, resulting in a loss of luminance and energy efficiency. The manganese activated zinc sulfide phosphor has a relatively high electrical to optical energy conversion efficiency of up to about 10 lumens per watt of input power and the cerium activated strontium sulfide phosphor as an energy conversion efficiency of 1 lumen per watt, relatively high for blue emission. However, the spectral emission for these phosphors is quite wide, with that for the zinc sulfide based phosphor material spanning the colour spectrum from green to red and that for the strontium sulfide based material spanning the range from blue to green, thus necessitating the use of the optical filters. The spectral emission of the cerium activated strontium sulfide phosphor can be shifted to some degree towards the blue by controlling the deposition conditions and activator concentration, but not to the extent required to eliminate the need for an optical filter.

Alternate blue phosphor materials have been evaluated that have narrower emission spectra tuned to provide the colour coordinates required for blue sub-pixels. These include cerium activated alkaline earth thiogallate compounds. These give good blue colour coordinates, but have relatively poor luminosity and stability. Since the host materials are ternary compounds, it is relatively difficult to control the stoichiometry of the phosphor films. Europium activated barium thioaluminate phosphors provide excellent blue colour coordinates and higher luminance, but again as a ternary compound, its stoichiometry is difficult to control.

Various methods have been developed in order to deposit phosphor films yielding a high luminosity. One such method is the vacuum deposition of phosphor films comprising europium activated barium thioaluminate. This is accomplished from a single source pellet using sputtering or electron beam evaporation however, this method has not yielded films with high luminosity. Improved luminance of barium thioaluminate phosphors has been achieved by using a hopping electron beam deposition method to deposit films from two source pellets. The stoichiometry of the deposited phosphor film is controlled by controlling the relative dwell time of the electron beam impinging on each of the two source materials. This method is not however, readily scalable to facilitate commercial production of large area displays and furthermore it cannot be controlled to compensate for changes in the evaporation rates from the two sources as the deposition proceeds and the source pellets are depleted.

Another method that has been adopted to improve the stoichiometry of deposited thioaluminate phosphors is to use more than one source for the deposition requiring added controls over the relative deposition rates for the different sources. The required relative evaporation rates must be calibrated for each specific piece of deposition equipment and the requirement for multiple sources constrains the design of the deposition equipment, generally adding to the cost of the equipment. Further, evaporation methods are not well suited for the deposition of large area films such as a required for the fabrication of large electronic displays such as those for wall television applications.

U.S. patent application Ser. No. 10/036,559 (the entirety of which is incorporated herein by reference) discloses a phosphor film deposition method that utilizes two sputtering targets to deposit a rare earth activated alkaline earth thioaluminate phosphor film. One of the sputtering targets comprises aluminum and the other sputtering target comprises the remaining ingredients in the phosphor, typically one or more alkaline earth sulfides and a rare earth sulfide or oxide as a source of the activator species. The use of two sputtering targets facilitates modulation of the relative deposition rate of materials arising from each source which facilitates deposition of a laminated film with a periodic composition alternately rich and poor in aluminum. The variation is achieved by using a rotating or oscillating substrate that is alternately positioned in the flux of atomic species sputtered from the respective targets and the thickness of the layers can be altered by changing the rotation rate or the oscillation rate of the substrate. However, the composition modulation across the thickness of the deposited layer is problematical for subsequent reaction of the deposited materials to form a homogeneous single phase phosphor material, since atomic species are required to diffuse within the deposited film to achieve a homogeneous composition on an atomic scale.

U.S. Pat. No. 6,447,654 (the entirety of which is incorporated herein in its entirety) discloses the sputtering of thioaluminate phosphor films from a single target comprising aluminum sulfide and alkaline earth sulfides. The sputtering method can be used to deposit ternary and other chemically complex phosphor materials such as green-emitting magnesium calcium thioaluminate and blue-emitting barium magnesium thioaluminate phosphor materials by adjusting the target composition to account for differential condensation rates of the target elements on the phosphor film substrate. This method does not however, fully solve the problem of providing a phosphor film that can both be etched and is stable in display operation and at the same time be economically used for the deposition of phosphor films over large areas.

While there are several different methods to deposit phosphor materials, it is desirable to develop a method for the deposition of phosphor materials for thick film dielectric electroluminescent displays that obviates one or more of the disadvantages of the prior art methods. In particular, it is desirable to develop a novel deposition method whereby a homogeneous single phase phosphor material is deposited with minimal compositional variation over the surface and across the thickness of the deposited phosphor in a manner that is economical for large areas as is required for the fabrication of large electronic displays such as those for wall television applications.

SUMMARY OF THE INVENTION

The present invention is a novel method for depositing large area multi-element thin film compositions and in particular thin film phosphors for electroluminescent displays and in particular for thick film dielectric electroluminescent displays. The method provides thin film phosphors with a high, yet uniform, luminosity and a suitable and desirable emission color. The method allows for the deposition of a phosphor film that can be etched in a patterning step and then further heat treated to form a stable phosphor film. The present method is also advantageous as it reduces the severity of the process conditions required to condition the deposited phosphor materials to minimize damage to the underlying substrate structure during phosphor conditioning.

According to an object of an aspect of the present invention there is provided a method for the deposition of a multi element thin film composition onto a substrate, the method comprising;
  sputtering a single composite target having two component phases in a low pressure sputtering atmosphere comprising gases containing reactive species and non-reactive species, said two component phases containing metallic and non metallic materials that contribute to the multi element thin film composition; and
  varying the pressure of said reactive species within said sputtering atmosphere to control the sputtering rate of said two component phases of said composite target to cause the ratio of the metallic and non metallic materials in said two component phases to deposit in a desired ratio as a multi element thin film on said substrate.

According to an object of an aspect of the present invention there is provided a method for the deposition of a multi element thin film phosphor composition onto a substrate, the method comprising;
  sputtering a single composite target having two component phases in a low pressure sputtering atmosphere comprising gases containing reactive species and non-reactive species, said two component phases containing metallic and non metallic materials that contribute to the phosphor composition; and
  varying the pressure of said reactive species within said sputtering atmosphere to control the sputtering rate of said two component phases of said composite target to cause the ratio of the metallic and non metallic materials in said two component phases to deposit in a desired ratio as a phosphor film on said substrate.

According to another object of an aspect of the present invention, there is provided a composite sputtering target for use in deposition methods to deposit a thin film multi-element phosphor composition, said composite sputtering target comprising two component phases selected from the group consisting of;
  a matrix phase and an inclusion phase; and
  two matrix phases;
  wherein one of said phases comprises one or more metallic materials that contribute to the phosphor composition and the other of said phases comprises the remaining non metallic materials that contribute to the phosphor composition, said two component phases being non reactive with each other prior to deposition According to still another aspect of the present invention is a single source sputtering method for the deposition of a multi element thin film phosphor composition onto a substrate, the method comprising;
  a) providing a single composite target comprising two component phases selected from the group consisting of;
  a matrix phase and an inclusion phase; and
  two matrix phases;
  wherein one of said phases comprises one or more metallic materials that contribute to the phosphor composition and the other of said phases comprises the remaining non metallic materials that contribute to the phosphor composition, said two component phases being non reactive with each other prior to deposition;

b) placing said single composite target in a low pressure sputtering atmosphere comprising gases containing reactive species and non-reactive species; and c) applying sufficient power to said composite target and varying the pressure of said reactive species within said sputtering atmosphere to control the sputtering rate of said matrix and inclusion phases of said composite target to cause the ratio of the metallic and non metallic materials in the two component phases to deposit in a desired ratio as a phosphor on said substrate.

According to yet another object of an aspect of the present invention there is provided a single source sputtering method for the deposition of a multi element thin film composition onto a substrate, the method comprising;

a) providing a single composite target comprising two component phases selected from the group consisting of;
   a matrix phase and an inclusion phase; and
   two matrix phases;
   wherein one of said phases comprises one or more metallic materials that contribute to the thin film composition and the other of said phases comprises the remaining non metallic materials that contribute to the thin film composition, said two component phases being non reactive with each other prior to deposition;

b) placing said single composite target in a low pressure sputtering atmosphere comprising gases containing reactive species and non-reactive species; and c) applying a power density of about 3 to 5 watts per $cm^2$ to said composite target and varying the pressure of said reactive species within said sputtering atmosphere to control the sputtering rate of said matrix and inclusion phases of said composite target to cause the ratio of the elements in the two component phases to deposit in a desired ratio as a thin film on said substrate.

In aspects, the composite sputtering target is of a composition that an alkaline earth thioaluminate or thiooxyaluminate phosphor film is deposited upon the sputtering of the composite target in a suitable low pressure atmosphere of reactive process gas under suitable power conditions. An activator species selected to provide the desired light emission colour is also added to the non-metallic inclusion phase of the composite target.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from said detailed description.

BRIEF DESCRIPTION OF THE DRAWINGS

The present invention will become more fully understood from the description given herein, and from the accompanying drawings, which are given by way of illustration only and do not limit the intended scope of the invention.

DETAILED DESCRIPTION OF THE INVENTION

Figure 1:
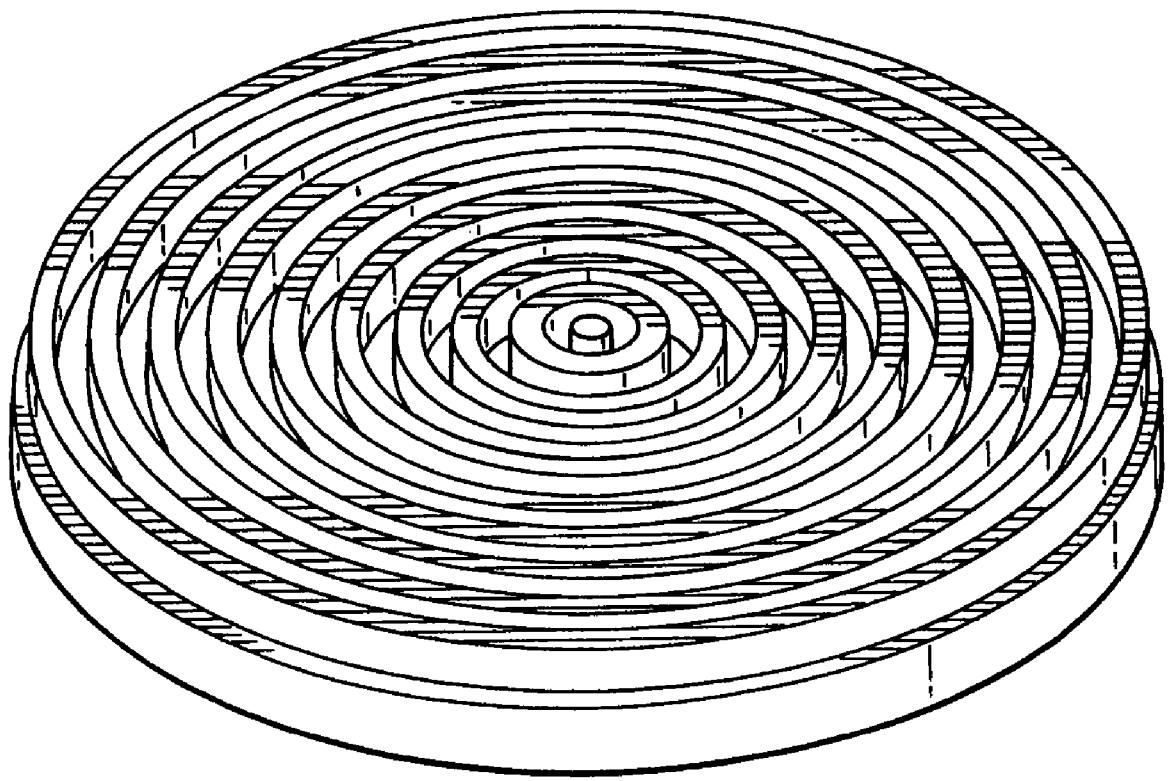
FIG. 1 shows a drawing of a representative matrix portion of an embodiment of a composite sputtering target having concentric circular grooves that are to be filled with compacted alkaline earth sulfide.

The present invention is a novel method to deposit multi-element thin film compositions and in particular multi-element thin phosphor film compositions that provide a high, yet uniform, luminosity and desirable emission colour. The method facilitates the deposition of homogeneous layers of phosphor with minimal compositional variation over the surface and across the thickness of the deposited phosphor. The phosphors are deposited within a thick film dielectric electroluminescent device.

The method provides an effective means to control the stoichiometry of deposited films, particularly those containing three or more atomic species. The method of the invention employs sputtering in a sputtering atmosphere of a single composite target wherein the relative sputtering rate of the component phases in the composite target is controlled by changing the composition and pressure of the reactive chemical species in the sputtering atmosphere. The present method employing reactive sputtering is advantageous because the component phases of the composite target are unreactive with each other until sputtering is effected and then the sputtered species react with one or more atomic or molecular species on the substrate of a surface under deposition. In this manner, a desirable phosphor layer is deposited on a selected substrate.

The method utilizes a single sputtering target having a composite structure to deposit a phosphor film having a multi-element chemical composition, preferably an alkaline earth thioaluminate phosphor film. An activator species (for example, cerium or terbium or europium) selected to provide the desired light emission colour, is also provided within the composite sputtering target.

The composite sputtering target comprises two component phases which are a combination of a continuous or matrix phase and a discontinuous or inclusion phase, or alternatively a combination of two continuous matrix phases having two interpenetrating matricies. Together the two phases contribute to the ingredients of the phosphor including the activator species. One of the phases, whether matrix or inclusion, must be fabricated to be electrically conductive and thus of a metallic material and the other phase is fabricated to be non electrically conductive and thus of a non-metallic material and also contain the remaining ingredients of the phosphor film composition and typically contains the activator to provide the desired light emission colour. It is however, possible to incorporate the activator into the metallic material. The two phases are unreactive with each other until sputtering of the target is effected.

The metallic material for use to make the matrix or inclusion phase of the composite target is selected from a metal or thermally and electrically conductive alloy. In aspects of the invention where it is desired to deposit a thin, film alkaline earth thioaluminate phosphor composition or thin film alkaline earth thiooxyaluminate phosphor composition, the metal is selected from the group consisting of aluminum, gallium and indium. For gallium, the composite target temperature is preferably below the melting point of gallium in order to maintain the mechanical integrity of the target. While it is also necessary to stay below the melting point for the other metals as well, indium and aluminum have higher melting temperatures compared to gallium.

The non-metallic material for use to make the matrix or inclusion phase of the composite target is typically one or more sulfide or oxide materials such as one or more alkaline earth sulfides and a rare earth sulfide or oxide as a source of the activator species. Again, in aspects of the invention where it is desired to deposit a thin film alkaline earth thioaluminate phosphor composition or thin film alkaline earth thiooxyaluminate phosphor composition, the non-metallic material is selected from the group consisting of a sulfide, oxysulfide and oxide of an element from Group IIA or IIB of the Periodic Table of Elements. The activator species is most typically included with the non-metallic material.

In a preferred embodiment the composite target comprises a combination of a matrix phase and an inclusion phase where the matrix phase of the composite target is metallic and the inclusion phase is non-metallic since this allows sputtering at higher power densities. The use of a matrix phase that is metallic provides the target with continuous electrical conductivity to prevent electrical charging of the target during sputtering operations. However, in certain other embodiments of the composite target the matrix phase can be made to be non metallic and the inclusion phase metallic, where reduced charger dissipation and reduced thermal deposition is tolerated for sputtering at lower power density. In still further embodiments, the composite may comprise two matrix phases, one metallic and the other non metallic.

The composite sputtering target is provided such that the ratio of the exposed surface area of the metallic material of the matrix phase to the non-metallic material of the inclusion phase in the active sputtering zone remains substantially constant during the sputtering process and is in the range of about 0.1 to 0.7 and in some aspects in the range of about 0.2 to 0.6.

Again, in a preferred embodiment for the composite target, it is desirable to have the matrix phase comprised of a metallic material that is a metal or thermally and electrically conductive alloy and the inclusion phase being a non metallic material that is a chemical compound or mixture thereof that is not electrically conductive. The electrically conductive phase may form a continuous network or matrix containing the non-conductive phase, so that charge accumulated from the sputtering process can be removed from the composite target to facilitate higher sputtering rates. The composite target is designed so that the dimensions of the non-metallic regions are sufficiently small that electronic charge accumulated during the sputtering process can be adequately discharged to the metallic component during the sputtering process. The composite target is also designed to have a high thermal conductance to enable the composite target temperature to be controlled, even at high sputtering rates of up to about 2 nanometers per second and a power density of up to about 4.5 watts per square centimeter of composite target area.

The composite sputtering target of the present invention may take several different embodiments and forms as described supra depending on whether the matrix phase is fabricated to comprise the metallic material(s) and also depending on whether a matrix and inclusion phase are present or alternatively two matrix phases to make up the ingredients of the phosphor composition. For example, the composite sputtering target may be a metal disc (representing a matrix phase) engraved on the active sputtering surface with a network of grooves wherein the grooves are filled with a non-conductive sputtering material (representing an inclusion phase). For a particular application for thioaluminate phosphors, the width of the grooves is about 2-3 millimeters and the spacing between grooves is about 3 millimeters. A representative drawing of the target is shown in FIG. 1. This embodiment of the composite sputtering target is suitable for continuous in-line sputtering where the deposition substrates are scanned past the target at a constant rate.

Figure 2:
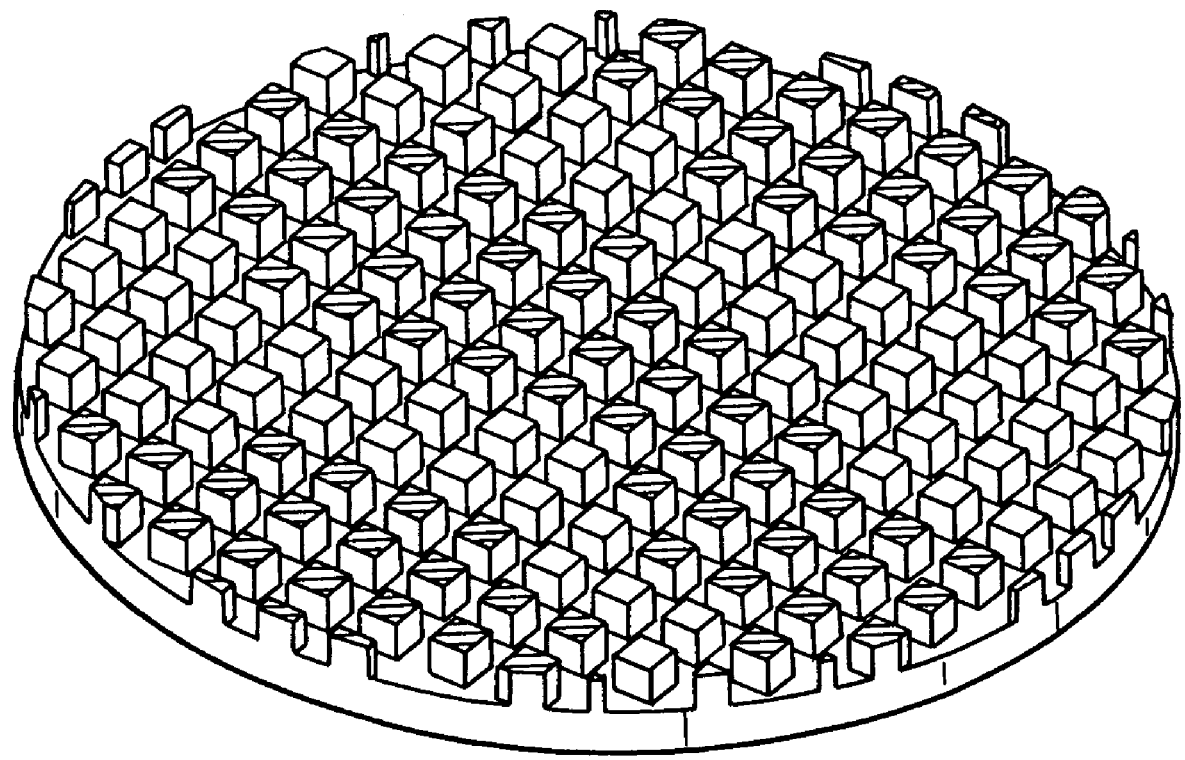
FIG. 2 shows a drawing of a representative matrix portion of another embodiment of a composite sputtering target having intersecting sets of parallel grooves that are to be filled with compacted alkaline earth sulfide.

Another form of the composite sputtering target is a metallic disc (representing a matrix phase) wherein the actively sputtered surface has substantially equally spaced concentric grooves wherein the grooves are filled with a non-conductive sputtering material (representing an inclusion phase). The width of the grooves is about 5-6 millimeters and the spacing between the grooves is about 2 millimeters. Because of the larger scale of the non-uniformity of the target surface area, this embodiment of the composite sputtering target is particularly suitable for sputtering systems where the substrate to be sputtered is at a longer distance from the target than in the previous form of an engraved metal disc described supra with reference to FIG. 1. A representative drawing of this composite target is shown in FIG. 2.

The composite sputtering target may also be in the form of a porous plaque of the non-metallic phase (representing a matrix phase) formed by partial sintering followed by infusion of the connected porosity of the plaque with molten metal (representing a second matrix phase) supplying the metallic components of the phosphor composition. In this embodiment, the two matrix phases (one metallic and one non metallic) interpenetrate with each other. This form of the composite sputtering target has the advantage of ease of manufacture and in addition provides a connected metallic phase having continuous electrical conductance and high thermal conductance to provide charge dissipation and facilitate heat removal from the target to regulate the target temperature.

Still another form of the composite sputtering target is a matrix of the non-metallic phase (representing a matrix phase) in which is embedded discrete metallic bodies comprising spheres or pellets of the metallic materials (representing an inclusion phase). This form of the composite sputtering target does not provide the benefit of charge dissipation or high heat dissipation, but can be used for lower sputtering rates.

The sputtering of the composite target is carried out in a low pressure sputtering atmosphere comprising gases containing reactive and non-reactive species. The sputtering atmosphere comprises one or more chemical reactive species that react with the surface of one or both of the component phases of the composite target to control the relative sputtering rate per unit of exposed area of the two component phases as a function of the partial pressure of the reactive species. The reactive species in the sputtering atmosphere may be a sulfur-bearing compound selected from the group consisting of hydrogen sulfide, atomic sulfur and diatomic sulfur and may comprise mixtures thereof. Non-reactive species present in the sputtering atmosphere may be selected for example from argon, nitrogen and any inert gas or gases and mixtures thereof. In this manner, the composition of the deposited film can be controlled independently of the relative area of the actively sputtered surfaces of the respective phases of the composite target. Further, because the metallic (for example aluminum) and alkaline earth components of the deposited film composition are initially kept physically apart within the composite structure of the target, they do not react with one another before they are deposited on the deposition substrate.

In this aspect of the invention, the nominal relative concentration of atomic species to be deposited on the target is set by setting the ratio of exposed surface within the active sputtering zone of the two component phases of the composite target in conjunction with the composition and pressure of the reactive species in the sputtering atmosphere gases and controlling the actual composition during the sputtering process by regulating the pressure and composition of the reactive species in the sputtering atmosphere. The pressure and composition of the reactive species in the sputtering atmosphere is regulated by controlling the injection rate of the respective reactive species making up the reactive process gas within the sputtering atmosphere in relation to the reaction rate of the reactive species within the deposition chamber, and the pumping rate of the gases making up the sputtering atmosphere from the deposition chamber. The ability to change the relative sputtering rate from the two component phases of the composite target allows flexibility in setting the relative surface area of the target components to meet other requirements such as adequate charge dissipation and ease of target manufacture. Again, the composite sputtering target is provided such that the ratio of the exposed surface area of the metallic material of one of the component phases of the composite target to the non-metallic materials of one of the component phases of the composite in the active sputtering zone remains substantially constant during the sputtering process and is in the range of about 0.1 to 0.7 and in some aspects in the range of about 0.2 to 0.6. Control of the sputtering process to achieve the desired composition of the deposited film is relatively simple, requiring regulation of only the partial pressure, of the reactive species such as for example the sulfur-bearing component within the sputtering atmosphere gases. Suitable pressures for use in the method of the present invention are about 0.05 Pa to about 0.3 Pa.

The deposition can be done in any contemporary rf magnetron sputtering system such as those marketed by Edwards™, Ulvac™, Leybold™ etc. that is fitted with a gas injection and exhaust system capable of handling hydrogen sulfide and other reactive process gas species and has a deposition substrate heating means. Sputtering may be conducted at powers of about 3 to 5 watts per cm$^2$.

In one embodiment of the method of the invention, the composite sputtering target comprises an aluminum metallic matrix phase and the non-conductive inclusion phase is a rare earth doped alkaline earth sulfide. The reactive species in the sputtering atmosphere is hydrogen sulfide or atomic or diatomic sulfur, in the partial pressure range of about 0.05 Pa to about 0.3 Pa. The partial pressure of the sulfur-bearing species is adjusted in accordance with the ratio of the exposed surface area of the metallic and non-metallic components of the composite target in the active sputtering zone within the sputtering atmosphere to cause the ratio of the elements in the two components to deposit on the phosphor film substrate in the desired ratio. The rf power applied to the target is in the range of about 3 to 5 watts per square centimeter, and more preferably in the range of about 3.3 to 4.5 watts per square centimeter. The sputtering rate from the aluminum matrix phase is a decreasing function of the hydrogen sulfide or sulfur pressure as a result of increasing passivation of the aluminum surface with an aluminum sulfide. By contrast the sulfide inclusion phase is effectively independent of the hydrogen sulfide or sulfur pressure. Thus for a given target, the ratio of aluminum to barium in the deposited film is a decreasing function of the hydrogen sulfide to argon ratio in the sputtering deposition atmosphere.

Where some oxygen is present in the sputtering atmosphere, the minimum required sputtering rate is dependent on the allowable oxygen content in the deposited film and the residual oxygen content in the sputtering atmosphere. Typically oxygen in(the sputtering atmosphere will react with the deposited film, with the rate of reaction dependent on the composition of the film and the presence of adsorbed water or other catalytic species. The sputtering process is carried out in a sufficiently short time in order that the maximum oxygen content in the film is not exceeded, and hence the sputtering rate must be sufficient to complete the deposition in this time. The process conditions can otherwise be optimized to achieve the desired results as is understood by those of skill in the sputtering art.

In summary, the present method enables the deposition of multi-element thin phosphor films that provide a high, yet uniform, luminosity and desirable emission colour. The method facilitates the deposition of homogeneous layers of phosphor with minimal compositional variation over the surface and across the thickness of the deposited phosphor. In particular, the phosphors are deposited within a thick film dielectric. electroluminescent device as is described for example in U.S. Pat. No. 5,432,015 (the disclosure of which is incorporated herein by reference). Briefly, the display is characteristically constructed on a rigid heat resistant substrate by a method that entails first depositing the lower electrode structure, then depositing the thick dielectric structure and finally depositing a thin film structure incorporating phosphors and an upper conductor that is optically transparent. Annealing of the phosphor material may be conducted at temperatures of about 700° C. to about 1100° C. as is understood by those of skill in the art. The entire structure is covered with a sealing layer that protects the thick and thin film structures from degradation due to moisture or other atmospheric contaminants.

The data contained in the following examples is limited to barium thioaluminate phosphors with a range of elemental ratios, but it is understood that the method can be extended to thioaluminate, thiogallate and thioaluminate compositions in combination with one or more elements from group IIA and IIB of the Periodic Table of Elements and thiooxyaluminates, thiooxygallates and thiooxyindates in combination with one or more elements from group IIA and IIB of the periodic Table of Elements.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLE 1

A series of barium aluminum sulfide phosphor films were deposited using the method of the present invention. The targets were 7.6 centimeter diameter aluminum discs with two sets of intersecting parallel grooves. The grooves were filled with a non-conductive sputtering material. The width of the grooves was 2 millimeters and the spacing between grooves was 3 millimeters. The depth of the grooves was 4 millimeters. The grooves were filled with barium sulfide doped with 5 mole percent of europium sulfide. The barium sulfide was pressed to compact it within the grooves. A plan view of the target is shown in FIG. 2. During sputtering, 150 watts of rf power was applied to the target. The sputtering atmosphere was established by introducing argon at 7 standard cubic centimeters per minute (sccm) and hydrogen sulfide at 4 sccm into the sputtering chamber to maintain a working pressure of about 0.093 Pa. This gave an argon to hydrogen sulfide partial pressure ratio of 1.75:1. Under these conditions the deposition rate was 13.3 Angstroms per second. The sputtering time was about 5 minutes to yield a phosphor film thickness of about 400 nanometers. The films were deposited on a thick film substrate comprising an alumina base upon which a gold electrode was deposited followed by a thick film composite dielectric layer and then a thin film barium titanate layer that were deposited using the techniques described in U.S. patent application Ser. No. 09/761,971 (the disclosure of which is incorporated herein in its entirety). Following deposition, the films were heat treated at a temperature of about 730° C. in-situ in the sputtering chamber without breaking the vacuum, but with the introduction of oxygen at a pressure of about 1 Pa.

The substrates with deposited phosphors were finished into complete electroluminescent devices by depositing a thin alumina layer on top of the phosphor and depositing an indium tin oxide transparent conductor layer on top of the alumina layer to form a second device electrode. The devices were tested using alternating polarity 40 microsecond wide voltage pulses with a voltage amplitude of 60 volts above the optical threshold voltage where the optical threshold voltage was the voltage at which the device began emitting light with a luminosity greater than 1 candela per square meter. The pulse frequency was 240 Hertz. The device exhibited an optical threshold voltage of 138 volts and a blue luminance of 133 candelas per square meter with a CIE y coordinate of 0.106.

The aluminum to barium ratio in the phosphor film, as measured by chemical analysis of a film deposited on a silicon wafer positioned next to the device substrate during deposition was about 4:4. The performance of the sputtered phosphor in this device was superior to that of phosphors deposited using known electron beam evaporation methods.

EXAMPLE 2

An electroluminescent device similar to that of example 1 was prepared, except that the deposition rate was 12 Angstoms per second rather than 13 Angstoms per second, the working pressure was about 0.086 Pa rather than 0.093 Pa and the annealing temperature following deposition was about 760° C. rather than 730° C. The performance of this device was similar to that of example 1, with a threshold voltage of 153 volts, and a luminance of 126 candelas per square meter with a CIE y coordinate of 0.126. This demonstrated that while performance is dependent somewhat on the annealing temperature, some variation in the annealing temperature was acceptable without serious impairment of the device performance.

EXAMPLE 3

An electroluminescent device similar to that of example 1 was prepared, except that the target was inscribed with concentric circular grooves rather than intersection parallel grooves for insertion of the europium doped barium sulfide as shown in FIG. 2. For sputtering, the ratio of argon to hydrogen sulfide in the sputtering atmosphere was seven parts to two parts by volume, the working pressure was about 0.19 Pa and the deposition rate was about 10.9 Angstroms per second. The device was provided a silicon nitride thin film dielectric layer on top of the phosphor film instead of an alumina layer. The luminance of this device was 98 candelas per square meter, lower than that of example 1 and 2. The sputtering rate was somewhat lower than for the first two examples due to the ratio of exposed aluminum to exposed barium sulfide on the surface of the target. It was thought that the silicon nitride dielectric layer was mostly responsible for the reduced luminance as compared to that of the first two examples. It is possible that some of the luminance difference was due to a change in the ratio of aluminum to barium caused by changes in the target configuration and deposition conditions.

EXAMPLE 4

An electroluminescent device similar to that of example 1 was prepared, except that the target was a disc of compacted europium doped barium sulfide powder in which pellets of aluminum metal were uniformly dispersed. The pellet diameter was approximately 4 millimeters and the ratio of aluminum to barium sulfide in the target was set to provide a ratio of the areas of exposed aluminum to exposed barium sulfide of about 1:5. Other differences were a process atmosphere pressure of 0.16 Pa rather than 0.073 Pa and a sputtering rate of 6.4 Angstroms per second rather than 13.3 Angstroms per second. The device was provided with a silicon nitride layer on top of the phosphor layer. A lower deposition rate resulted in a longer deposition time and, hence, in oxygen contaminating the phosphor during deposition. The higher oxygen content may have accounted for the lower luminance of 83 candelas per square meter and the higher CIE y coordinate of 0.14 measured for this device. The shifted y coordinate may have also be attributable to a change in the aluminum to barium ratio.

Although preferred embodiments of the invention have been described herein in detail, it will be understood by those skilled in the art that variations may be made thereto without departing from the spirit of the invention or the scope of the appended claims.

The invention claimed is:

1. A method for the deposition of a multi element thin film phosphor composition onto a substrate, the method comprising;
   sputtering a single composite target having two component phases in a sputtering atmosphere comprising gases containing reactive species and non-reactive species, said two component phases containing metallic and non metallic materials that contribute to the phosphor composition; and
   varying the pressure of said reactive species within said sputtering atmosphere to control the sputtering rate of said two component phases of said composite target to cause the ratio of the elements in said two component phases to deposit in a desired ratio as a phosphor film on said substrate.

2. The method of claim 1, wherein said pressure of said reactive species within said sputtering atmosphere is adjusted in accordance with the ratio of an exposed surface area of the two component phases of said composite target in an active sputtering zone to cause the ratio of the metallic and non metallic materials in said phases to deposit as a phosphor film in a desired ratio on a substrate.

3. The method of claim 2, wherein said composite sputtering target is provided such that the ratio of an exposed surface area of the phase containing metallic materials to the phase containing non-metallic materials in the active sputtering zone remains substantially constant during sputtering of said composite target and is in the range of about 0.1 to 0.7.

4. The method of claim 3, wherein said ratio is in the range of about 0.2 to 0.6.

5. The method of claim 1, wherein said reactive species comprises hydrogen sulfide, atomic sulfur and/or diatomic sulfur.

6. The method of claim 1, wherein said non-reactive species comprises one or more inert gases.

7. The method of claim 6, wherein said inert gas is selected from the group consisting of argon, nitrogen and mixtures thereof.

8. The method of claim 1, wherein said pressure is about 0.05 Pa to about 0.3 Pa.

9. The method of claim 1, wherein sputtering is conducted at a power density of about 3 to 5 watts per $cm^2$.

10. The method of claim 2, wherein said metallic materials are selected from the group consisting of a metal and a thermally and electrically conductive metal alloy.

11. The method of claim 10, wherein said metal is selected from the group consisting of aluminum, gallium and indium.

12. The method of claim 2, wherein said non metallic materials comprise chemical compounds selected from the group consisting of sulfides, oxysulfides and oxides of an element from Group IIA or IIB of the Periodic Table of Elements and a rare earth element.

13. The method of claim 12, wherein said rare earth element is selected from the group consisting of europium, terbium and cerium.

14. The method of claim 1, wherein said composite target comprises two component phases selected from the group consisting of:
 a matrix phase and an inclusion phase; and
 two matrix phases;
 wherein one of said phases comprises one or more metallic materials that contribute to the phosphor composition and the other of said phases comprises the remaining non metallic materials that contribute to the phosphor composition.

15. The method of claim 14, wherein said matrix phase comprises a metallic matrix of aluminum and said inclusion phase comprises a rare earth doped alkaline earth sulfide.

16. The method of claim 14, wherein said composite sputtering target comprises a matrix phase provided as a metallic disc having an engraved surface of grooves containing said inclusion phase.

17. The method of claim 16, wherein said grooves are substantially parallel.

18. The method of claim 17, wherein said grooves are about 2-3 mm wide and spaced about 3 mm apart.

19. The method of claim 16, wherein said grooves are substantially concentric.

20. The method of claim 19, wherein said grooves are about 5-6 mm wide and spaced about 2 mm apart.

21. The method of claim 14, wherein said inclusion phase is provided as a porous plaque having pores filled with said matrix phase that comprises a metal or metal alloy.

22. The method of claim 14, wherein said inclusion phase is in the form of discrete metallic bodies selected from pellets or spheres provided in a non-metallic matrix.

23. The method of claim 1, wherein said thin film phosphor composition is an alkaline earth thioaluminate phosphor.

24. The method of claim 23, wherein said phosphor is barium thioaluminate activated with europium.

25. The method of claim 1, wherein said thin film phosphor composition is an alkaline earth thiooxyaluminate phosphor.

26. The method of claim 23, wherein said phosphor is further annealed at a temperature of about 700° C. to about 1100° C.

27. The method of claim 26, wherein said phosphor is provided within a thick film dielectric electroluminescent device.

28. A composite sputtering target for use in deposition methods to deposit a thin film multi-element phosphor composition, said composite sputtering target comprising two component phases selected from the group consisting of;
 a matrix phase and an inclusion phase; and
 two matrix phases;
 wherein one of said phases comprises one or more metallic materials selected from the group consisting of aluminum, gallium and indium that contribute to the phosphor composition and the other of said phases comprises one or more non metallic materials that are chemical compounds that contribute to the phosphor composition, said two component phases being non reactive with each other prior to deposition.

29. The target of claim 28, wherein said inclusion phase comprises one or more chemical compounds selected from the group consisting of sulfides, oxysulfides and oxides of an element from Group IIA or IIB of the Periodic Table of Elements.

30. The target of claim 29, wherein said inclusion phase further comprises an activator species of a rare earth metal.

31. The target of claim 30, wherein said metallic matrix is aluminum and said inclusion phase comprises a rare earth doped alkaline earth sulfide.

32. The target of claim 28, wherein said composite target comprises a matrix phase provided as a metallic disc having an engraved surface of grooves containing said inclusion phase.

33. The target of claim 32, wherein said grooves are substantially parallel.

34. The target of claim 33, wherein said grooves are about 2-3 mm wide and spaced about 3 mm apart.

35. The target of claim 32, wherein said grooves are substantially concentric.

36. The target of claim 35, wherein said grooves are about 5-6 mm wide and spaced about 2 mm apart.

37. The target of claim 28, wherein said inclusion phase is provided as a porous plaque with pores filled with said metallic matrix phase.

38. The target of claim 28, wherein said inclusion phase is provided as discrete metallic bodies selected from pellets and spheres in a non-metallic matrix phase.

39. The target of claim 28, wherein said composite target comprises a metallic matrix phase and a non metallic matrix phase, said phases interpenetrating with each other.

40. A single source sputtering method for the deposition of a multi element thin film phosphor composition onto a substrate, the method comprising;
 a) providing a single composite target comprising two component phases selected from the group consisting of;
 a matrix phase and an inclusion phase; and two matrix phases;

wherein one of said phases comprises one or more metallic materials that contribute to the phosphor composition and the other of said phases comprises the remaining non metallic materials that contribute to the phosphor composition, said two component phases being non reactive with each other prior to deposition;

b) placing said single composite target in a sputtering atmosphere comprising gases containing reactive species and non-reactive species; and c) applying sufficient power to said composite target and varying the pressure of said reactive species within said sputtering atmosphere to control the sputtering rate of said matrix and inclusion phases of said composite target to cause the ratio of the elements in the two component phases to deposit in a desired ratio as a phosphor on said substrate.

41. The method of claim 40, wherein said pressure of said reactive species within said sputtering atmosphere is adjusted in accordance with the ratio of an exposed surface area of the two component phases of said composite target in an active sputtering zone to cause the ratio of the metallic and non metallic materials in said phases to deposit as a phosphor film in a desired ration on a substrate.

42. The method of claim 41, wherein said composite sputtering target is provided such that the ratio of an exposed surface area of the metallic materials to the non-metallic materials in the active sputtering zone remains substantially constant during sputtering of said composite target and is in the range of about 0.1 to 0.7.

43. The method of claim 42, wherein said ratio is in the range of about 0.2 to 0.6.

44. The method of claim 43, wherein said reactive species comprises hydrogen sulfide, atomic sulfur and/or diatomic sulfur.

45. The method of claim 44, wherein said non-reactive species comprises one or more inert gases.

46. The method of claim 45, wherein said inert gas is selected from the group consisting of argon, nitrogen and mixtures thereof.

47. The method of claim 46, wherein said pressure is about 0.05 Pa to about 0.3 Pa.

48. The method of claim 40, wherein sputtering is conducted at a power density of about 3 to 5 watts per cm$^2$.

49. The method of claim 40, wherein said metallic materials are selected from the group consisting of a metal and a thermally and electrically conductive metal alloy.

50. The method of claim 49, wherein said metal is selected from the group consisting of aluminum, gallium and indium.

51. The method of claim 49, wherein said non metallic materials comprise chemical compounds selected from the group consisting of sulfides, oxysulfides and oxides of an element from Group IIA or IIB of the Periodic Table of Elements and a rare earth element.

52. The method of claim 51, wherein said rare earth element is selected from the group consisting of europium, terbium and cerium.

53. A single source sputtering method for the deposition of a multi element thin film composition onto a substrate, the method comprising;

a) providing a single composite target comprising two component phases selected from the group consisting of;

a matrix phase and an inclusion phase; and two matrix phases;

wherein one of said phases comprises one or more metallic materials that contribute to the thin film composition and the other of said phases comprises the remaining non metallic materials that contribute to the thin film composition, said two component phases being non reactive with each other prior to deposition;

b) placing said single composite target in a sputtering atmosphere comprising gases containing reactive species and non-reactive species; and c) applying a power density of about 3 to 5 watts per cm$^2$ to said composite target and varying the pressure of said reactive species within said sputtering atmosphere to control the sputtering rate of said matrix and inclusion phases of said composite target to cause the ratio of the elements in the two component phases to deposit in a desired ratio as a thin film on said substrate.

54. The method of claim 53, wherein said pressure of said reactive species within said sputtering atmosphere is adjusted in accordance with the ratio of an exposed surface area of the two component phases of said composite target in an active sputtering zone to cause the ratio of the metallic and non metallic materials in said phases to deposit as a thin film in a desired ratio on a substrate.

55. The method of claim 54, wherein said composite sputtering target is provided such that the ratio of an exposed surface area of the phase containing metallic materials to the phase containing non-metallic materials in the active sputtering zone remains substantially constant during sputtering of said composite target and is in the range of about 0.1 to 0.7.

56. The method of claim 55, wherein said ratio is in the range of about 0.2 to 0.6.

57. The method of claim 53, wherein said reactive species comprises hydrogen sulfide, atomic sulfur and/or diatomic sulfur.

58. The method of claim 57, wherein said non-reactive species comprises one or more inert gases selected from the group consisting of argon, nitrogen and mixtures thereof.

59. The method of claim 58, wherein said pressure is about 0.05 Pa to about 0.3 Pa.

* * * * *